(12) United States Patent
Gao et al.

(10) Patent No.: US 9,165,956 B2
(45) Date of Patent: Oct. 20, 2015

(54) ARRAY SUBSTRATE AND MANUFACTURING METHOD THEREOF

(71) Applicant: BOE TECHNOLOGY GROUP CO., LTD., Beijing (CN)

(72) Inventors: Tao Gao, Beijing (CN); Weifeng Zhou, Beijing (CN); Feng Zhang, Beijing (CN); Zhijun Lv, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 214 days.

(21) Appl. No.: 14/027,413

(22) Filed: Sep. 16, 2013

(65) Prior Publication Data

US 2014/0077207 A1    Mar. 20, 2014

(30) Foreign Application Priority Data

Sep. 17, 2012 (CN) .......................... 2012 1 0345680

(51) Int. Cl.
*H01L 27/12* (2006.01)
*G02F 1/1368* (2006.01)
*G02F 1/1362* (2006.01)

(52) U.S. Cl.
CPC .......... *H01L 27/1288* (2013.01); *G02F 1/1368* (2013.01); *H01L 27/124* (2013.01); *H01L 27/1222* (2013.01); *H01L 27/1225* (2013.01); *G02F 1/136227* (2013.01); *G02F 2001/136236* (2013.01)

(58) Field of Classification Search
CPC ............ H01L 27/1222; H01L 27/1225; H01L 27/1288; H01L 21/00; H01L 21/16; H01L 21/479; H01L 21/02554; H01L 21/02565
USPC .......................... 438/104, 158; 257/43, 59, 72
See application file for complete search history.

(56) References Cited

U.S. PATENT DOCUMENTS

| 2008/0002125 | A1 | 1/2008 | Kim |
| 2008/0042134 | A1* | 2/2008 | Jung et al. ..................... 257/59 |
| 2009/0032819 | A1 | 2/2009 | Lim et al. |
| 2012/0188478 | A1 | 7/2012 | Kuwabara |

FOREIGN PATENT DOCUMENTS

| CN | 101349844 A | 1/2009 |
| TW | 201234437 A | 8/2012 |

OTHER PUBLICATIONS

Extended European Search Report dated Jan. 2, 2014; Appln. No. 13184705.5-1904.
First Chinese Office Action dated Aug. 1, 2014; Appln. No. 201210345680.1.

* cited by examiner

*Primary Examiner* — Monica D Harrison
(74) *Attorney, Agent, or Firm* — Ladas & Parry LLP

(57) ABSTRACT

Embodiments of the present invention relate to an array substrate and a manufacturing method thereof. The manufacturing method comprises: step 1: forming a gate line, a gate electrode, a first insulating layer, an active layer and ohmic contact layers on a base substrate by a first patterning process using a gray-tone or half-tone mask, in which the active layer between the ohmic contact layers corresponds to a channel region; step 2: forming a second insulating layer and a pixel electrode film on the base substrate obtained after the step 1 by a second patterning process using a gray-tone or half-tone mask; and step 3: forming a drain electrode, a source electrode, a data line and a passivation layer on the base substrate obtained after the step 2 by a third patterning process using a gray-tone or half-tone mask.

20 Claims, 7 Drawing Sheets

ARRAY SUBSTRATE AND MANUFACTURING METHOD THEREOF

TECHNICAL FIELD

Embodiments of the present invention relate to an array substrate and a manufacturing method thereof.

BACKGROUND

A thin-film transistor liquid crystal display (TFT-LCD) has the advantages of small volume, low power consumption, non-radiation, etc. and has prevailed in the current flat panel display market. As for the TFT-LCD, the product performance, the yield and the price of the TFT-LCD are determined by a structure and a manufacturing process of an array substrate.

Currently, the array substrate is manufactured by using many patterning processes. In order to effectively reduce the price of the TFT-LCD and improve the yield of the TFT-LCD, the manufacturing process of the array substrate is gradually simplified, that is, from the original seven patterning processes to four patterning processes based on the gray-tone mask technology. The current four patterning processes technology utilizes a gray-tone or half-tone mask to finish the patterning of an active layer, a data line, a source electrode, a drain electrode and a channel region for a thin-film transistor (TFT) by one patterning process.

As each patterning process generally includes photoresist coating, exposure, development, etching, striping and other processes, the number of the patterning processes can be used for measuring the complexity of the manufacturing process of the array substrate. In the manufacturing process of the array substrate, the fewer the number of the patterning processes adopted is, the shorter the production time is, the higher the production efficiency is, the lower the manufacturing cost is.

SUMMARY

Embodiments of the present invention provide an array substrate and a manufacturing method thereof. The manufacturing method adopts three patterning processes to manufacture the array substrate and hence has the advantages of shortening the production cycle, reducing the production cost and improving the production efficiency.

An embodiment of the present invention provides an array substrate, comprising: a base substrate; a gate electrode and a gate line, disposed on the base substrate; a first insulating layer, an active layer and ohmic contact layers, sequentially formed on the gate electrode and the gate line; a second insulating layer, formed on the base substrate on which the active layer and the ohmic contact layers are formed, wherein contact holes are formed in the second insulating layer at positions corresponding to the ohmic contact layers; a pixel electrode film, disposed on the same layer with the second insulating layer at other regions of the base substrate except an region covered by the second insulating layer, and a part of the pixel electrode film is disposed in the contact holes of the second insulating layer; a drain electrode, a source electrode and a data line, formed on the second insulating layer and the pixel electrode film; and a passivation layer, formed on the drain electrode, the source electrode and the data line, wherein a part of the pixel electrode film directly contacting the drain electrode except a part positioned in the contact holes and another part of the pixel electrode film formed integrally therewith are together used as a pixel electrode.

An embodiment of the present invention provides a method for manufacturing an array substrate, comprising: step 1: forming a gate line, a gate electrode, a first insulating layer, an active layer and ohmic contact layers on a base substrate by a first patterning process using a gray-tone or half-tone mask, in which the active layer between the ohmic contact layers corresponds to a channel region; step 2: forming a second insulating layer and a pixel electrode film on the base substrate obtained after the step 1 by a second patterning process using a gray-tone or half-tone mask; and step 3: forming a drain electrode, a source electrode, a data line and a passivation layer on the base substrate obtained after the step 2 by a third patterning process using a gray-tone or half-tone mask.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

In embodiments of the present invention, an array substrate can be prepared by three patterning processes and hence the production cycle is shortened, the production cost is reduced and the production efficiency is improved.

Figure 1:
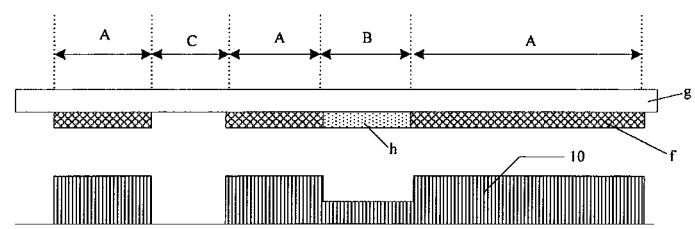
FIG. 1 is a schematic diagram of a gray-tone or half-tone mask according to an embodiment of the present invention.

As illustrated in FIG. 1, a gray-tone or half-tone mask according to an embodiment of the present invention is as follows: the gray-tone or half-tone mask includes a transparent quartz glass substrate g, an opaque film f and a semi-transparent film h, wherein the opaque film f is made of opaque light-blocking material; and the semi-transparent film h can allow a part or a half of light to be transmitted through. The gray-tone or half-tone mask comprises a completely light-blocking region A, a partially-light-transmitting region B and a completely light-transmitting region C.

Taking a positive photoresist as an example, when used, one photoresist layer 10 is firstly coated on a thin-film material layer to be patterned; after light coming from a light source is used to irradiate the gray-tone or half-tone mask, the light cannot transmit through the completely light-blocking region A, so that a region of the photoresist layer corresponding to the completely light-blocking region A is formed as a non-exposure region; the photoresist in the non-exposure region is completely retained after development, so that the region is formed as a photoresist-completely-retained region; a part of the light can transmit through the partially-light-transmitting region B, so that a region of the photoresist layer corresponding to the partially-light-transmitting region B is formed as a partial exposure region; the photoresist in the partial exposure region is partially removed after development, so that the region is formed as a photoresist-partially-retained region; the light totally transmits through the completely light-transmitting region C, so that a region of the photoresist layer corresponding to the completely light-transmitting region C is formed as a full exposure region; and the photoresist in the full exposure region is completely removed after development, so that the region is formed as a photoresist-completely-removed region.

Further detailed description is given to an embodiment of the present invention with reference to the accompanying drawings.

Figure 2:
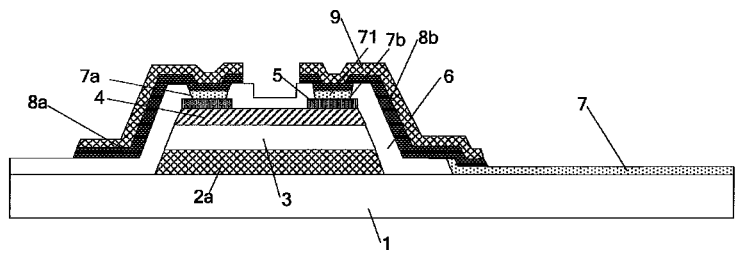
FIG. 2 is a sectional structural view of an array substrate according to an embodiment of the present invention.

As illustrated in FIG. 2, the array substrate provided by the embodiment of the present invention comprises: a base substrate 1; a gate electrode 2a and a gate line (not shown in the figure) disposed on the base substrate 1; a first insulating layer 3, an active layer 4 and ohmic contact layers 5 sequentially disposed on the gate electrode 2a and the gate line, in which in which the active layer 4 between the ohmic contact layers 5 corresponds to a channel region; a second insulating layer 6 disposed on the base substrate 1 on which the active layer 4 and the ohmic contact layers 5 are formed; a pixel electrode film 71 disposed on the same layer with the second insulating layer 6 at other regions of the base substrate 1 except an region covered by the second insulating layer 6, wherein contact holes 7a and 7b are formed in the second insulating layer 6 at positions corresponding to the ohmic contact layers 5, a part of the pixel electrode film is disposed in the contact holes of the second insulating layer, and a part of the pixel electrode film 71 makes contact with the ohmic contact layers 5 through the contact holes; a source electrode 8a, a drain electrode 8b and a data line (not shown in the figure) disposed on the second insulating layer 6, wherein a part of the pixel electrode film 71 directly contacting the drain electrode 8b except a part positioned in the contact holes and another part of the pixel electrode film 71 formed integrally therewith are together used as a pixel electrode 7; and a passivation layer 9 disposed on the source electrode 8a, the drain electrode 8b and the date line.

Alternatively, the gate electrode and the gate line are made of any one selected from a group consisting of molybdenum (Mo), aluminum (Al), copper (Cu), tungsten (W) and the like or an alloy formed by at least two metals selected from the group; the first insulating layer is made of silicon nitride ($SiN_x$), silicon oxide ($SiO_x$) or a combination of the silicon nitride ($SiN_x$) and the silicon oxide ($SiO_x$); the active layer is made of semiconductor material, such as, amorphous silicon (a-Si, a-Si: H), polycrystalline silicon and indium gallium zinc oxide (IGZO) or any other semiconductor material used for forming a circuit channel in a transistor; the ohmic contact layer is made of a doped semiconductor material, such as, N-doped silicon and P-doped silicon. Exemplarily, the doped semiconductor material is the N-doped silicon.

Alternatively, the second insulating layer is made of silicon nitride ($SiN_x$), silicon oxide ($SiO_x$) or a combination of the silicon nitride ($SiN_x$) and the silicon oxide ($SiO_x$); the drain electrode, the source electrode and the data line are made of any one selected from a group consisting of molybdenum (Mo), aluminum (Al), copper (Cu), tungsten (W) and the like or an alloy formed by at least two metals selected from the group; the pixel electrode is made of an oxide, such as, indium tin oxide (ITO), indium zinc oxide (IZO) and aluminum zinc oxide; and the passivation layer is made of silicon nitride ($SiN_x$), silicon oxide ($SiO_x$) or a combination of the silicon nitride ($SiN_x$) and the silicon oxide ($SiO_x$).

Exemplarily, the gate electrode, the gate line, the drain electrode, the source electrode and the data line are made of the same material; and the first insulating layer, the second insulating layer and the passivation layer are made of the same material.

Moreover, the embodiment of the present invention also provides a method for manufacturing the array substrate mentioned above, which comprises the following steps:

step 1: forming a gate line, a gate electrode, a first insulating layer, an active layer and ohmic contact layers on a base substrate by a first patterning process using a gray-tone or half-tone mask, in which the active layer between the ohmic contact layers corresponds to a channel region;

step 2: forming a second insulating layer and a pixel electrode film on the base substrate obtained after the step 1 by a second patterning process using a gray-tone or half-tone mask; and step 3: forming a drain electrode, a source electrode, a data line and a passivation layer on the base substrate obtained after the step 2 by a third patterning process using a gray-tone or half-tone mask.

Figure 3A:
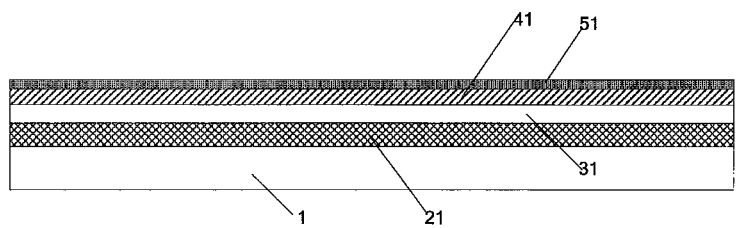
FIG. 3A is a cross-sectional structural view of the array substrate after various thin film layers are deposited on a base substrate in a first patterning process.
Figure 3B:
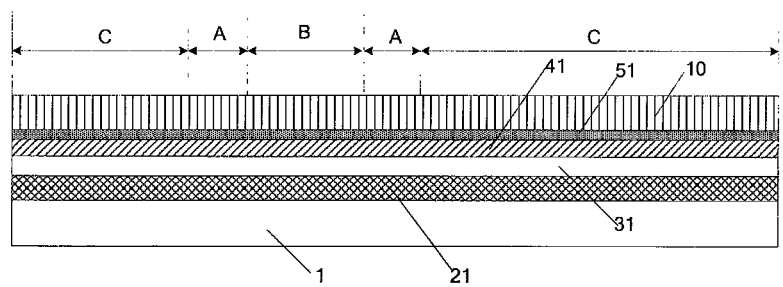
FIG. 3B is a cross-sectional structural view of a TFT region of the array substrate after a photoresist is coated in the first patterning process.
Figure 3C:
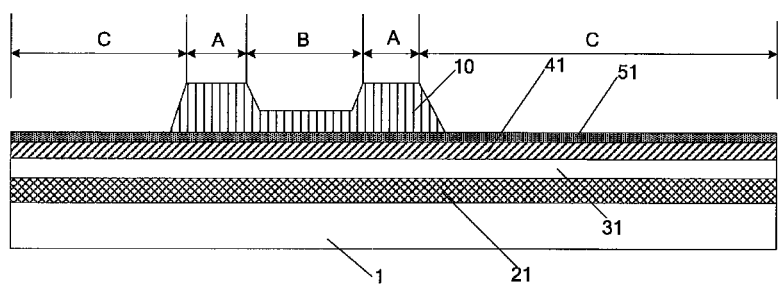
FIG. 3C is a cross-sectional structural view of the TFT region of the array substrate after the photoresist is exposed and developed in the first patterning process.
Figure 3D:
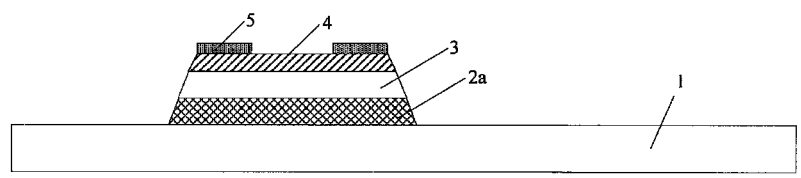
FIG. 3D is a cross-sectional structural view of the TFT region of the array substrate obtained after the first patterning process according to an embodiment of the present invention.
Figure 3E:
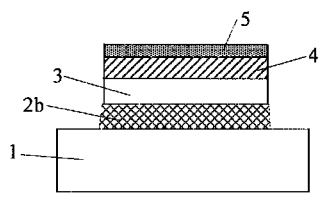
FIG. 3E is a cross-sectional structural view of an region in which a gate line of the array substrate is disposed after the first patterning process according to an embodiment of the present invention.

Exemplarily, the step 1 further comprises the following steps:

step 11: sequentially depositing a gate metal thin film 21, a first insulating layer thin film 31, a semiconductor thin film 41 and a doped semiconductor thin film 51 on the base substrate 1, as illustrated in FIG. 3A, wherein the gate metal thin film 21 is used to form the gate electrode and the gate line, has a thickness of 1,500 to 2,500 angstroms, and is made of any one selected from a group consisting of molybdenum (Mo), aluminum (Al), copper (Cu), tungsten (W) and the like or an alloy formed by at least two metals selected from the group; the first insulating layer thin film 31 is used to form the first insulating layer, has a thickness of 2,500 to 4,000 angstroms, and is made of silicon nitride, silicon oxide or a combination of the silicon nitride and the silicon oxide, the semiconductor thin film 41 is used to form the active layer and has a thickness of 800 to 1,500 angstroms; and the doped semiconductor thin film 51 is used to form the ohmic contact layers and has a thickness of 500 to 1,000 angstroms;

step 12: coating a photoresist 10 on the base substrate 1 obtained after the step 11, as illustrated in FIG. 3B, and by a exposing process and a developing process using the gray-tone or half-tone mask, forming a first photoresist-completely-retained region A, a first photoresist-partially-retained region B and a first photoresist-completely-removed region C, as illustrated in FIG. 3C, wherein the first photoresist-partially-retained region B corresponds to the channel region; the first photoresist-completely-retained region A corresponds to regions in which the gate line and the gate electrode are disposed except the channel region, and the first photoresist-completely-removed region C corresponds to regions on the base substrate except the above regions; and step 13: forming the gate electrode 2a, the gate line 2b, the first insulating layer 3, the active layer 4 and the ohmic contact layers 5 on the base substrate 1 obtained after the step 12, as illustrated in FIGS. 3D and 3E, wherein FIG. 3D is a cross-sectional structural view of a region in which the gate electrode is disposed after the first patterning process, and FIG. 3E is a cross-sectional structural view of a region in which the gate line 2b is disposed after the first patterning process.

Exemplarily, the step 11 further comprises the following steps:

depositing the gate metal thin film on the base substrate by using a magnetron sputtering method or a thermal evaporation method; and sequentially depositing the first insulating layer thin film, the semiconductor thin film and the doped semiconductor thin film on the base substrate obtained after the above step is finished, by using a chemical vapor deposition method, wherein a reaction gas during the deposition of the first insulating layer thin film by using the chemical vapor deposition method may be a mixed gas of silane ($SiH_4$), ammonia ($NH_3$) and nitrogen ($N_2$) or a mixed gas of dichlorosilane ($SiH_2Cl_2$), $NH_3$ and $N_2$; a reaction gas during the deposition of the semiconductor thin film by using the chemical vapor deposition method may be a mixed gas of $SiH_4$ and hydrogen ($H_2$) or a mixed gas of $SiH_2Cl_2$ and $H_2$; and a reaction gas during the deposition of the doped semiconductor thin film by using the chemical vapor deposition method may be a mixed gas of $SiH_4$, phosphine ($PH_3$) and hydrogen ($H_2$) or a mixed gas of $SiH_2Cl_2$, $PH_3$ and $H_2$.

Exemplarily, the step 13 further comprises the following steps of:

etching away the gate metal thin film 21, the first insulating layer thin film 31, the semiconductor thin film 41 and the doped semiconductor thin film 51 corresponding to the first photoresist-completely-removed region by one etching process;

removing the photoresist in the first photoresist-partially-retained region by one ashing process;

etching away the doped semiconductor thin film 51 corresponding to the first photoresist-partially-retained region by one etching process, and thus, exposing the semiconductor thin film to form the channel region, and for example, the etching process may be a dry etching process; and removing the photoresist in the first photoresist-completely-retained region.

Figure 4A:
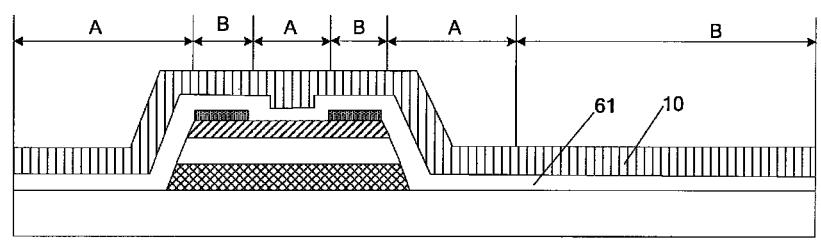
FIG. 4A is a cross-sectional structural view of a TFT region of an array substrate after the photoresist is coated in a second patterning process according to an embodiment of the present invention.
Figure 4B:
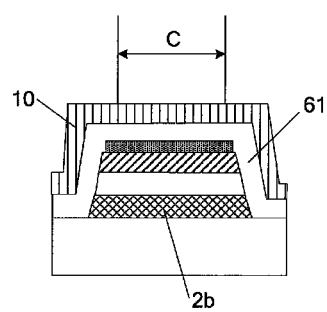
FIG. 4B is a cross-sectional structural view of a region of the array substrate in which the gate line is disposed after the photoresist is coated in the second patterning process according to an embodiment of the present invention.
Figure 4C:
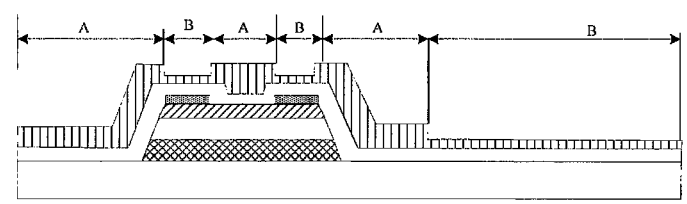
FIG. 4C is a cross-sectional structural view of the TFT region of the array substrate after the photoresist is exposed and developed in the second patterning process according to an embodiment of the present invention.
Figure 4D:
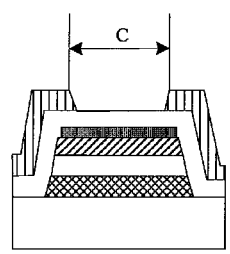
FIG. 4D is a cross-sectional structural view of the region of the array substrate in which the gate line is disposed after the photoresist is exposed and developed in the second patterning process according to an embodiment of the present invention.

Exemplarily, the step 2 further comprises the following steps:

step 21: depositing the second insulating layer thin film 61 on the base substrate 1 obtained after the step 1 is finished by using a chemical vapor deposition method, wherein the second insulating layer thin film 61 is used to form the second insulating layer, has a thickness of 2,500 to 4,000 angstroms, and is made of silicon nitride, silicon oxide or a combination of the silicon nitride and the silicon oxide; and a reaction gas during the deposition of the second insulating layer thin film by using the chemical vapor deposition method may be a mixed gas of $SiH_4$, $NH_3$ and $N_2$ or a mixed gas of $SiH_2Cl_2$, $NH_3$ and $N_2$.

step 22: coating the photoresist 10 on the base substrate 1 obtained after the step 21 is finished, as illustrated in FIGS. 4A and 4B, wherein FIG. 4A is a cross-sectional structural view of a TFT region of an array substrate according to an embodiment of the present invention after the photoresist is coated, and FIG. 4B is a cross-sectional structural view of the array substrate after the photoresist is coated in the region at which the gate line 2b is disposed; and forming a second photoresist-completely-retained region A, a second photoresist-partially-retained region B and a second photoresist-completely-removed region C by a exposure process and a development process using a gray-tone or half-tone mask, as illustrated in FIGS. 4C and 4D, wherein FIG. 4C is a cross-sectional structural view of the TFT region of the array substrate obtained after the photoresist is exposed and developed, and FIG. 4D is a cross-sectional structural view of the region of the array substrate where the gate line 2b is disposed obtained after the photoresist is exposed and developed, wherein the second photoresist-completely-removed region C corresponds to a lead wire region of the gate line; the second photoresist-partially-retained region B corresponds to regions in which the ohmic contact layers and the pixel electrode are disposed; and the second photoresist-completely-retained region A corresponds to regions on the base substrate except the above regions; and step 23: forming the second insulating layer 6 and the pixel electrode film 71 on the base substrate 1 obtained after the step 22 is finished, wherein contact holes 7a and 7b are formed in the second insulating layer 6 at positions corresponding to the ohmic contact layers 5 and a part of the pixel electrode film 71 directly contacting the drain electrode to be formed later except a part positioned in the contact holes and another part of the pixel electrode film 71 formed integrally therewith are together used as a pixel electrode 7.

Figure 4E:
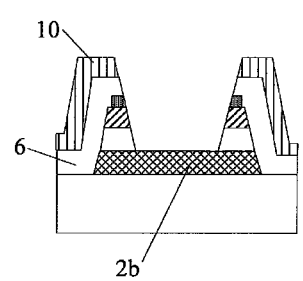
FIG. 4E is a cross-sectional structural view of the region in which the gate line is disposed after a etching process is performed in a second photoresist-completely-removed region, in the second patterning process according to an embodiment of the present invention.
Figure 4F:
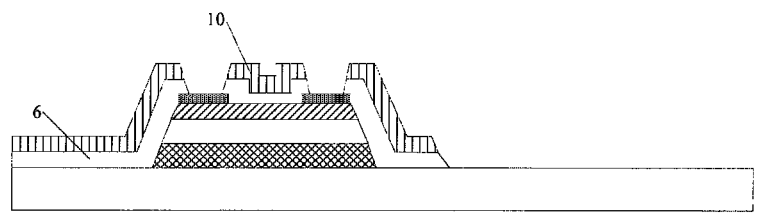
FIG. 4F is a cross-sectional structural view of the TFT region after a etching process of a second photoresist-partially-retained region, in the second patterning process according to an embodiment of the present invention.
Figure 4G:
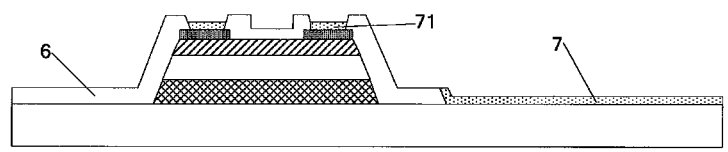
FIG. 4G is a cross-sectional structural view of the TFT region of the array substrate after the second patterning process according to an embodiment of the present invention.
Figure 4H:
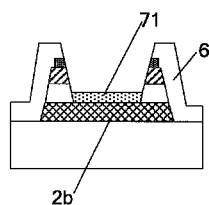
FIG. 4H is a cross-sectional structural view of the region in which the gate line of the array substrate is disposed after the second patterning process according to an embodiment of the present invention.

Exemplarily, the step 23 further comprises:

etching away the second insulating layer thin film, the doped semiconductor thin film, the semiconductor thin film and the first insulating layer thin film in the lead wire region for the gate line corresponding to the second photoresist-completely-removed region by one etching process to expose a gate metal layer, as illustrated in FIG. 4E, wherein the etching process in the step may be, for example, a dry etching process;

removing the photoresist in the second photoresist-partially-retained region by one ashing process;

etching away the second insulating layer thin film corresponding to the second photoresist-partially-retained region by one etching process and thus exposing the doped semiconductor thin film to form the contact holes 7a and 7b at positions corresponding to the ohmic contact layers 5, as illustrated in FIG. 4F;

depositing a transparent conductive thin film 71 on the base substrate obtained after the above step is finished by using a magnetron sputtering method or a thermal evaporation method, wherein a part of the transparent conductive thin film 71 is used as the pixel electrode 7, and the transparent conductive thin film 71 has a thickness of 500 to 1,500 angstroms, and is made of an oxide, such as, ITO, IZO and aluminum zinc oxide; and removing the photoresist 10 in the second photoresist-completely-retained region, so as to form the pixel electrode film 71, as illustrated in FIGS. 4G and 4H, wherein FIG. 4G is a cross-sectional structural view of the TFT region of the array substrate after the second patterning process, and FIG. 4H is a cross-sectional structural view of the region in which the gate line 2b of the array substrate is disposed after the second patterning process.

Figure 5A:
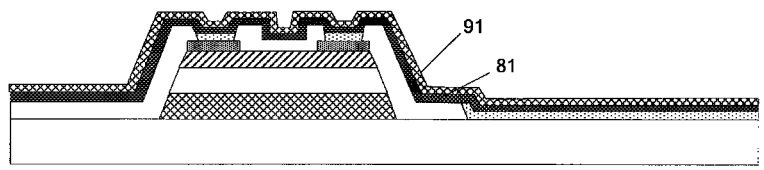
FIG. 5A is a cross-sectional structural view of the array substrate after various thin film layers are deposited on a base substrate in a third patterning process according to an embodiment of the present invention.
Figure 5B:
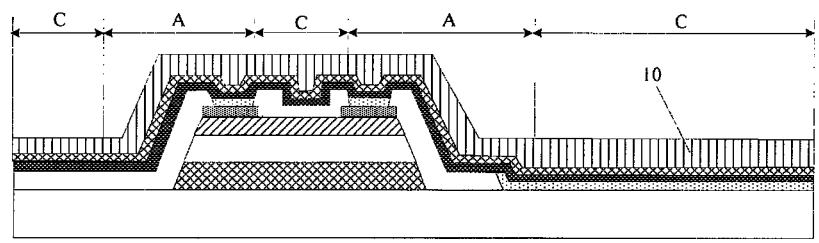
FIG. 5B is a cross-sectional structural view of a TFT region of an array substrate after the photoresist is coated in a third patterning process according to an embodiment of the present invention.
Figure 5C:
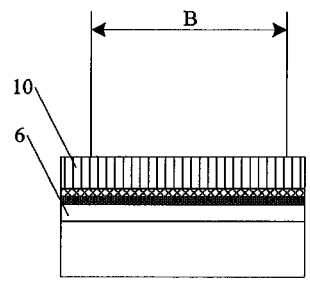
FIG. 5C is a cross-sectional structural view of a region of the array substrate in which the data line is disposed after the photoresist is coated in the third patterning process according to an embodiment of the present invention.
Figure 5D:
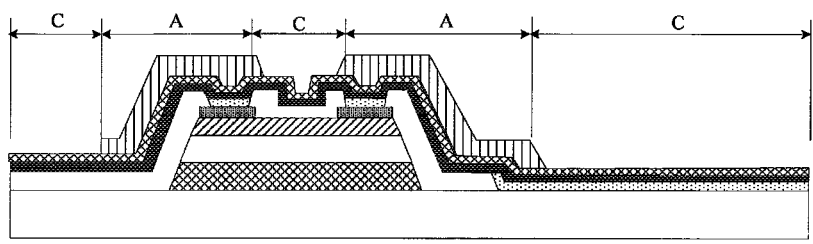
FIG. 5D is a cross-sectional structural view of the TFT region of the array substrate after the photoresist is exposed and developed in the third patterning process according to an embodiment of the present invention.
Figure 5E:
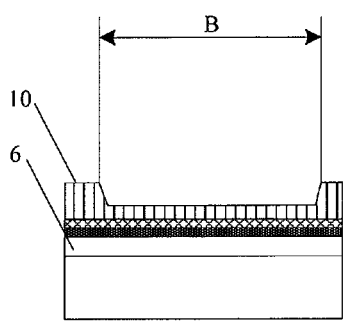
FIG. 5E is a cross-sectional structural view of the region in which the data line of the array substrate is disposed after the photoresist is exposed and developed in the third patterning process according to an embodiment of the present invention.
Figure 5F:
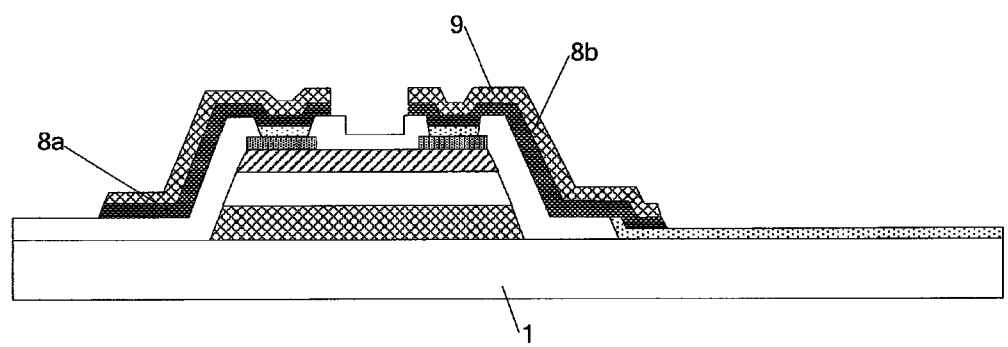
FIG. 5F is a cross-sectional structural view of the TFT region of the array substrate after the third patterning process according to an embodiment of the present invention.

Exemplarily, the step 3 further comprises the following steps:

step 31: sequentially depositing a drain-source metal film 81 and a passivation layer thin film 91 on the base substrate 1 obtained after the step 2 is finished, as illustrated in FIG. 5A, wherein the drain-source metal film 81 is used to form the drain electrode, the source electrode and the data line, is made of any one selected from a group consisting of molybdenum (Mo), aluminum (Al), copper (Cu), tungsten (W) and the like or an alloy formed by at least two metals selected from the group, and has a thickness of 1,500 to 2,500 angstroms; and the passivation layer thin film 91 is used to form the passivation layer, is made of silicon nitride, silicon oxide or a combination of the silicon nitride and the silicon oxide, and has a thickness of 2,500 to 4,000 angstroms.

step 32: coating the photoresist 10 on the base substrate 1 obtained after the step 31 is finished, as illustrated in FIGS. 5B and 5C, wherein FIG. 5B is a cross-sectional structural view of the TFT region of the array substrate after the photoresist is coated, and FIG. 5C is a cross-sectional structural view of the region in which the data line of the array substrate is disposed after the photoresist is coated; and forming a third photoresist-completely-retained region A, a third photoresist-partially-retained region B and a third photoresist-completely-removed region C by a exposure process and a development process using a gray-tone or half-tone mask, as illustrated in FIGS. 5D and 5E, wherein FIG. 5D is a cross-sectional structural view of the TFT region of the array substrate after the photoresist is exposed and developed, and FIG. 5E is a cross-sectional structural view of the region in which the data line of the array substrate is disposed after the photoresist is exposed and developed;

wherein the third photoresist-completely-retained region A corresponds to regions at which the source electrode, the drain electrode and the data line are disposed; the third photoresist-partially-retained region B corresponds to a lead wire region of the data line; and the third photoresist-completely-removed region C corresponds to regions on the base substrate except the above regions; and step 33: forming the source electrode 8a, the drain electrode 8b, the data line (not shown in the figure) and the passivation layer 9 on the base substrate 1 obtained after the step 32 is finished, as illustrated in FIG. 5F.

Exemplarily, the step 31 further comprises the following steps of:

depositing the drain-source metal film on the base substrate by using a magnetron sputtering method or a thermal evaporation method; and depositing the passivation layer thin film on the base substrate obtained after the above step is finished by using a chemical vapor deposition method, wherein a reaction gas during the deposition of the passivation layer thin film by using a chemical vapor deposition method is a mixed gas of $SiH_4$, $NH_3$ and $N_2$ or a mixed gas of $SiH_2Cl_2$, $NH_3$ and $N_2$.

Exemplarily, the step 33 further comprises the following steps of:

etching away the passivation layer thin film and the drain-source metal film corresponding to the third photoresist-completely-removed region by one etching process;

removing the photoresist in the third photoresist-partially-retained region by one ashing process;

etching away the passivation layer thin film corresponding to the third photoresist-partially-retained region by one etching process, and exposing the drain-source metal film, wherein the etching process in the step may be, for example, a dry etching process; and removing the photoresist in the third photoresist-completely-retained region, so as to form the source electrode 8a, the drain electrode 8b, the data line (not shown in the figure) and the passivation layer 9, as illustrated in FIG. 5F, and meanwhile, the lead wire region of the data line is also exposed.

Although the preferred embodiments of the present invention have been described, additional changes and modifications can be also made to the embodiments by those skilled in the art on the basis of the basic inventive concept. Therefore, the appended claims are intended to be construed as including the preferred embodiments and all the changes and modifications within the scope of the present invention.

In the embodiments of the present invention, the array substrate can be prepared by three patterning processes and hence has the advantages of shortened production cycle, reduced production cost and improved production efficiency. The method for manufacturing the array substrate provided by the embodiments of the present invention has the advantages of simple, reliable and easily achieved and has a wide application prospect.

The embodiment of the invention being thus described, it will be obvious that the same may be varied in many ways. Such variations are not to be regarded as a departure from the spirit and scope of the invention, and all such modifications as would be obvious to those skilled in the art are intended to be included within the scope of the following claims.

The invention claimed is:

1. An array substrate, comprising:
a base substrate;
a gate electrode and a gate line, disposed on the base substrate;
a first insulating layer, an active layer and ohmic contact layers, sequentially formed on the gate electrode and the gate line;
a second insulating layer, formed on the base substrate on which the active layer and the ohmic contact layers are formed, wherein contact holes are formed in the second insulating layer at positions corresponding to the ohmic contact layers;
a pixel electrode film, disposed on the same layer with the second insulating layer at other regions of the base substrate except an region covered by the second insulating layer, and a part of the pixel electrode film is disposed in the contact holes of the second insulating layer;
a drain electrode, a source electrode and a data line, formed on the second insulating layer and the pixel electrode film; and
a passivation layer, formed on the drain electrode, the source electrode and the data line,
wherein a part of the pixel electrode film directly contacting the drain electrode except the part positioned in the contact holes and another part of the pixel electrode film formed integrally therewith are together used as a pixel electrode.

2. The array substrate according to claim 1, wherein the gate electrode and the gate line are made of any one selected from a group consisting of molybdenum (Mo), aluminum (Al), copper (Cu), tungsten (W) or an alloy formed by at least two metals selected from the group; the first insulating layer is made of silicon nitride ($SiN_x$), silicon oxide ($SiO_x$) or a combination of the silicon nitride ($SiN_x$) and the silicon oxide ($SiO_x$); the active layer is made of amorphous silicon (a-Si, a-Si: H), polycrystalline silicon and indium gallium zinc oxide (IGZO) or any other semiconductor material used for forming a channel in a transistor; and the ohmic contact layer is made of N-doped silicon or P-doped silicon.

3. The array substrate according to claim 1, wherein the second insulating layer is made of silicon nitride ($SiN_x$), silicon oxide ($SiO_x$) or a combination of the silicon nitride ($SiN_x$) and the silicon oxide ($SiO_x$); the drain electrode, the source electrode and the data line are made of any one selected from a group consisting of molybdenum (Mo), aluminum (Al), copper (Cu), tungsten (W) and the like or an alloy formed by at least two metals selected from the group; the pixel electrode is made of indium tin oxide (ITO), indium zinc oxide (IZO) and aluminum zinc oxide; and the passivation layer is made of silicon nitride ($SiN_x$), silicon oxide ($SiO_x$) or a combination of the silicon nitride ($SiN_x$) and the silicon oxide ($SiO_x$).

4. A method for manufacturing the array substrate according to claim 1, comprising:

step 1: forming a gate line, a gate electrode, a first insulating layer, an active layer and ohmic contact layers on a base substrate by a first patterning process using a gray-tone or half-tone mask, in which the active layer between the ohmic contact layers corresponds to a channel region;
step 2: forming a second insulating layer and a pixel electrode film on the base substrate obtained after the step 1 by a second patterning process using a gray-tone or half-tone mask; and
step 3: forming a drain electrode, a source electrode, a data line and a passivation layer on the base substrate obtained after the step 2 by a third patterning process using a gray-tone or half-tone mask.

5. The method according to claim 4, wherein the step 1 further comprises:
step 11: sequentially depositing a gate metal thin film, a first insulating layer thin film, a semiconductor thin film and a doped semiconductor thin film on the base substrate;
step 12: coating a photoresist on the base substrate obtained after the step 11, and by a exposing process and a developing process using the gray-tone or half-tone mask, forming a first photoresist-completely-retained region, a first photoresist-partially-retained region and a first photoresist-completely-removed region,
wherein the first photoresist-partially-retained region corresponds to the channel region; the first photoresist-completely-retained region corresponds to regions in which the gate electrode and the gate line are disposed except the channel region, and the first photoresist-completely-removed region corresponds to regions on the base substrate except the above regions; and
step 13: forming the gate electrode, the gate line, the first insulating layer, the active layer and the ohmic contact layers on the base substrate obtained after the step 12, and further comprises:
etching away the gate metal thin film, the first insulating layer thin film, the semiconductor thin film and the doped semiconductor thin film corresponding to the first photoresist-completely-removed region by one etching process;
removing the photoresist in the first photoresist-partially-retained region by one ashing process;
etching away the doped semiconductor thin film corresponding to the first photoresist-partially-retained region by one etching process, and thus, exposing the semiconductor thin film to form the channel region; and
removing the photoresist in the first photoresist-completely-retained region.

6. The method according to claim 5, wherein the step 11 further comprises:
depositing the gate metal thin film on the base substrate by using a magnetron sputtering method or a thermal evaporation method; and
sequentially depositing the first insulating layer thin film, the semiconductor thin film and the doped semiconductor thin film on the base substrate obtained after the above step is finished, by using a chemical vapor deposition method.

7. The method according to claim 6, wherein a reaction gas during the deposition of the first insulating layer thin film is a mixed gas of silane ($SiH_4$), ammonia ($NH_3$) and nitrogen ($N_2$) or a mixed gas of dichlorosilane ($SiH_2Cl_2$), $NH_3$ and $N_2$; a reaction gas during the deposition of the semiconductor thin film is a mixed gas of $SiH_4$ and hydrogen ($H_2$) or a mixed gas of $SiH_2Cl_2$ and $H_2$; and a reaction gas during the deposition of the doped semiconductor thin film is a mixed gas of $SiH_4$, phosphine ($PH_3$) and hydrogen ($H_2$) or a mixed gas of $SiH_2Cl_2$, $PH_3$ and $H_2$.

8. The method according to claim 5, wherein the gate metal thin film has a thickness of 1,500 to 2,500 angstroms, the first insulating layer thin film has a thickness of 2,500 to 4,000 angstroms, the semiconductor thin film has a thickness of 800 to 1,500 angstroms, and the doped semiconductor thin film has a thickness of 500 to 1,000 angstroms.

9. The method according to claim 5, wherein the gate metal thin film is made of any one selected from a group consisting of molybdenum (Mo), aluminum (Al), copper (Cu), tungsten (W) or an alloy formed by at least two metals selected from the group, the first insulating layer thin film is made of silicon nitride ($SiN_x$), silicon oxide ($SiO_x$) or a combination of the silicon nitride ($SiN_x$) and the silicon oxide ($SiO_x$).

10. The method according to claim 4, wherein the active layer is made of amorphous silicon (a-Si, a-Si: H), polycrystalline silicon and indium gallium zinc oxide (IGZO) or any other semiconductor material used for forming a circuit channel in a transistor, and the ohmic contact layer is made of a doped semiconductor material.

11. The method according to claim 10, wherein the doped semiconductor material is N-doped silicon or P-doped silicon.

12. The method according to claim 4, wherein the step 2 further comprises:
    step 21: depositing a second insulating layer thin film on the base substrate obtained after the step 1 is finished by using a chemical vapor deposition method;
    step 22: coating a photoresist on the base substrate obtained after the step 21 is finished, and forming a second photoresist-completely-retained region, a second photoresist-partially-retained region and a second photoresist-completely-removed region by a exposure process and a development process using a gray-tone or half-tone mask,
    wherein the second photoresist-completely-removed region corresponds to a lead wire region of the gate line, the second photoresist-partially-retained region corresponds to regions in which the ohmic contact layers and a pixel electrode are disposed; and the second photoresist-completely-retained region corresponds to regions on the base substrate except the above regions; and
    step 23: forming the second insulating layer and the pixel electrode film on the base substrate obtained after the step 22 is finished, and the step further comprises:
        etching away the second insulating layer thin film, the doped semiconductor thin film, the semiconductor thin film and the first insulating layer thin film in the lead wire region for the gate line corresponding to the second photoresist-completely-removed region by one etching process to expose a gate metal layer;
        removing the photoresist in the second photoresist-partially-retained region by one ashing process;
        etching away the second insulating layer thin film corresponding to the second photoresist-partially-retained region by one etching process and thus exposing the doped semiconductor thin film to form the contact holes in the second insulating layer at positions corresponding to the ohmic contact layers;
        depositing a transparent conductive thin film on the base substrate obtained after the above step is finished by using a magnetron sputtering method or a thermal evaporation method; and
        removing the photoresist in the second photoresist-completely-retained region, so as to form the pixel electrode film, wherein a part of the pixel electrode film directly contacting the drain electrode except a part positioned in the contact holes and another part of the pixel electrode film formed integrally therewith are together used as the pixel electrode.

13. The method according to claim 12, wherein the second insulating layer thin film is has a thickness of 2,500 to 4,000 angstroms, and the transparent conductive thin film has a thickness of 500 to 1,500 angstroms.

14. The method according to claim 12, wherein the second insulating layer thin film is made of silicon nitride, silicon oxide or a combination of the silicon nitride and the silicon oxide, and the transparent conductive film is made of ITO, IZO or aluminum zinc oxide.

15. The method according to claim 12, wherein a reaction gas during the deposition of the second insulating layer thin film is a mixed gas of $SiH_4$, $NH_3$ and $N_2$ or a mixed gas of $SiH_2Cl_2$, $NH_3$ and $N_2$.

16. The method according to claim 4, wherein the step 3 further comprises:
    step 31: sequentially depositing a drain-source metal film and a passivation layer thin film on the base substrate obtained after the step 2 is finished;
    step 32: coating a photoresist on the base substrate obtained after the step 31 is finished, and forming a third photoresist-completely-retained region, a third photoresist-partially-retained region and a third photoresist-completely-removed region by a exposure process and a development process using a gray-tone or half-tone mask,
    wherein the third photoresist-completely-retained region corresponds to regions in which the source electrode, the drain electrode and the data line are disposed, the third photoresist-partially-retained region corresponds to a lead wire region of the data line, and the third photoresist-completely-removed region corresponds to regions on the base substrate except the above regions; and
    step 33: forming the source electrode, the drain electrode, the data line and the passivation layer on the base substrate obtained after the step 32 is finished, and wherein the step further comprises:
        etching away the passivation layer thin film and the drain-source metal film corresponding to the third photoresist-completely-removed region by one etching process;
        removing the photoresist in the third photoresist-partially-retained region by one ashing process;
        etching away the passivation layer thin film corresponding to the third photoresist-partially-retained region by one etching process, and exposing the drain-source metal film; and
        removing the photoresist in the third photoresist-completely-retained region.

17. The method according to claim 16, wherein the step 31 further comprises:
    depositing the drain-source metal film on the base substrate by using a magnetron sputtering method or a thermal evaporation method; and
    depositing the passivation layer thin film on the base substrate obtained after the above step is finished by using a chemical vapor deposition method.

18. The method according to claim 17, wherein a reaction gas during the deposition of the passivation layer thin film is a mixed gas of $SiH_4$, $NH_3$ and $N_2$ or a mixed gas of $SiH_2Cl_2$, $NH_3$ and $N_2$.

19. The method according to claim 16, wherein the drain-source metal film has a thickness of 1,500 to 2,500 angstroms, and the passivation layer film has a thickness of 2,500 to 4,000 angstroms.

20. The method according to claim 16, wherein the drain-source metal thin film is made of any one selected from a group consisting of molybdenum (Mo), aluminum (Al), copper (Cu), tungsten (W) or an alloy formed by at least two metals selected from the group, and the passivation layer film is made of silicon nitride, silicon oxide or a combination of the silicon nitride and the silicon oxide.

* * * * *